United States Patent
Lin et al.

(10) Patent No.: US 8,098,791 B2
(45) Date of Patent: Jan. 17, 2012

(54) SHIFT REGISTER

(75) Inventors: Shih-Chyn Lin, Hsin-Chu (TW);
Hsiang-Pin Fan, Hsin-Chu (TW);
Wen-Pin Chen, Hsin-Chu (TW);
Kuei-Sheng Tseng, Hsin-Chu (TW);
Chen-Yi Wu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/789,622

(22) Filed: May 28, 2010

(65) Prior Publication Data

US 2011/0150169 A1    Jun. 23, 2011

(30) Foreign Application Priority Data

Dec. 22, 2009   (TW) ................................ 98144277 A

(51) Int. Cl.
*G11C 19/00* (2006.01)
(52) U.S. Cl. ................ 377/64; 377/78; 377/79
(58) Field of Classification Search .......... None
See application file for complete search history.

(56) References Cited

U.S. PATENT DOCUMENTS

| | | | | |
|---|---|---|---|---|
| 6,175,268 | B1 * | 1/2001 | Merrill ........................... | 327/574 |
| 6,177,831 | B1 * | 1/2001 | Yoneda et al. ................ | 327/537 |
| 7,778,379 | B2 * | 8/2010 | Liao et al. ..................... | 377/64 |
| 7,817,770 | B2 * | 10/2010 | Chang et al. .................. | 377/64 |
| 2004/0174349 | A1 | 9/2004 | Libsch et al. | |
| 2007/0217563 | A1 * | 9/2007 | Chang et al. .................. | 377/64 |
| 2010/0054392 | A1 * | 3/2010 | Chen et al. .................... | 377/79 |
| 2010/0150301 | A1 * | 6/2010 | Chan et al. .................... | 377/64 |
| 2010/0260312 | A1 * | 10/2010 | Tsai et al. ..................... | 377/79 |
| 2011/0002437 | A1 * | 1/2011 | Su et al. ........................ | 377/64 |
| 2011/0007863 | A1 * | 1/2011 | Tsai et al. ..................... | 377/79 |

OTHER PUBLICATIONS

"Design Methology for Low-Voltage MOSFETs" by Andoh et al., IEEE 1994, 4.4.1-4.4.4.*

* cited by examiner

*Primary Examiner* — Tuan T Lam
(74) *Attorney, Agent, or Firm* — Chun-Ming Shih

(57) ABSTRACT

A shift register includes a control circuit, a pull-up circuit and a pull-down circuit. The control circuit generates a control signal according to a start pulse signal during being enabled. The pull-up circuit produces a gate pulse signal according to a clock signal during being enabled by the control signal. The pull-up circuit includes a dual-gate transistor. A first gate of the dual-gate transistor is electrically coupled to the control signal, a second gate of the dual-gate transistor is electrically coupled to a predetermined voltage, the source/drain of the dual-gate transistor serves as an output terminal for the gate pulse signal, and the drain/source of the dual-gate transistor is electrically coupled to the clock signal. The pull-down circuit pulls a potential at the first gate and another potential at the output terminal down to a power supply potential during the pull-up circuit is disabled.

8 Claims, 3 Drawing Sheets

SHIFT REGISTER

CROSS-REFERENCE TO RELATED APPLICATIONS

This application is based upon and claims the benefit of priority from the prior Taiwan Patent Application No. 098144277, filed Dec. 22, 2009, the entire contents of which are incorporated herein by reference.

BACKGROUND

1. Technical Field

The present invention generally relates to display technology fields and, particularly to a shift register adapted for gate driving circuits of active matrix display devices.

2. Description of the Related Art

The displays with advanced functions play an important role in consumer electronic products. Liquid crystal displays serve as the chromatic screens having high resolution, which are widely utilized in mobile phones, personal digital assistants (PDAs), digital still cameras, computer displays, and notebook displays. The shift register, an important electric component in the gate driving circuit of a liquid crystal display panel, is widely used to drive a plurality of gate lines of the liquid crystal display panel. As a result, the design of shift register is closely related to the characteristics of the liquid crystal display panel, such as power consumption and reliability.

A conventional GOA circuit (i.e., a kind of gate driving circuit) includes a plurality of cascade-connected shift registers for generating gate pulse signals to sequentially drive the gate lines. A pull-up circuit of each of the shift registers uses a single-gate transistor to output the gate pulse signal.

In order to meet the increasing demand of high resolution, it is necessary to increase the size of the single-gate transistor so as to increase a conduction current thereof for providing a relatively larger driving capability as required by the high resolution. However, the size-increased single-gate transistor would inevitably result in excessive power consumption.

BRIEF SUMMARY

Accordingly, the present invention is directed to a shift register, so as to address the issues associated with the prior art.

More specifically, a shift register in accordance with an embodiment of the present invention includes a control circuit, a pull-up circuit and a pull-down circuit. The control circuit generates a control signal according to a start pulse signal during the control circuit is enabled. The pull-up circuit includes a dual-gate transistor and generates a gate pulse signal according to a clock signal during the pull-up circuit is enabled by the control signal. A first gate of the dual-gate transistor is electrically coupled to receive the control signal, a second gate of the dual-gate transistor is electrically coupled to receive a predetermined voltage, the first source/drain of the dual-gate transistor serves as an output terminal for the gate pulse signal, the second source/drain of the dual-gate transistor is electrically coupled to receive the clock signal. The pull-down circuit pulls a potential at the first gate of the dual-gate transistor and another potential at the output terminal for the gate pulse signal down to a power supply potential during the pull-up circuit is disabled.

In one embodiment, the shift register further includes a reset circuit. The reset circuit is adapted for resetting both of the potential at the first gate of the dual-gate transistor and the potential at the output terminal for the gate pulse signal.

In one embodiment, the control circuit includes a first transistor and a second transistor. The gate of the first transistor is electrically coupled to receive an enabling signal, the first source/drain of the first transistor is electrically coupled to the gate of the second transistor, and the second source/drain of the first transistor is electrically coupled to receive another clock signal phase-inverted with respect to the above-mentioned clock signal. The first source/drain of the second transistor serves as an output terminal for the control signal, and the second source/drain of the second transistor is electrically coupled to receive the start pulse signal. In alternative embodiment, the control circuit includes a single transistor, the first source/drain of the transistor serves as an output terminal for the control signal, the gate and the second source/drain of the transistor are electrically coupled with each other to receive the start pulse signal.

In one embodiment, the second gate of the dual-gate transistor is electrically connected with the first gate.

In one embodiment, the second gate of the dual-gate transistor is independent and insulated from the first gate.

In one embodiment, the second gate of the dual-gate transistor is electrically coupled to a direct current (DC) voltage.

In one embodiment, the second gate of the dual-gate transistor is electrically coupled to a variable voltage.

In one embodiment, the second gate of the dual-gate transistor is electrically coupled to the output terminal for the gate pulse signal.

In one embodiment, the pull-up circuit further includes a capacitor electrically coupled between the first gate and the first source/drain of the dual-gate transistor.

In summary, the above-mentioned embodiments of the present invention employ the dual-gate transistor in the pull-up circuit, compared with the single-gate transistor, the dual-gate transistor would have relatively larger conduction current than the single-gate transistor with the same size as the dual-gate transistor. Accordingly, the dual-gate transistor can be configured with a small size and thus can achieve the effect of low power consumption.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figures being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "coupled" and variations thereof herein are used broadly and encompass direct and indirect connections, and couplings. Accordingly, the drawings and descriptions will be regarded as illustrative in nature and not as restrictive.

Figure 1:
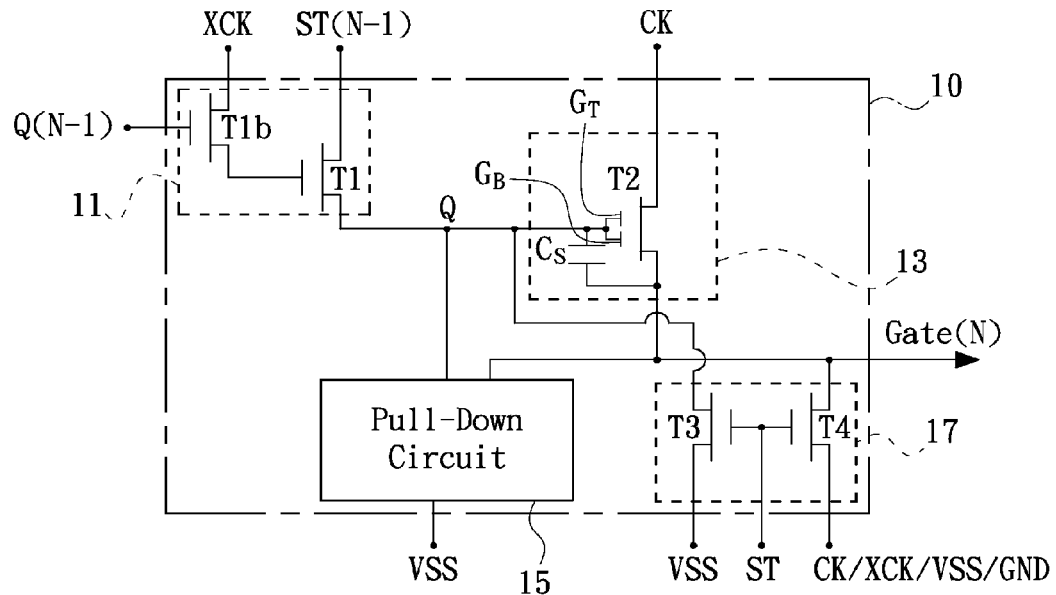
FIG. 1 is a schematic circuit diagram of a shift register in accordance with an embodiment of the present invention.

Referring to FIG. 1, a shift register 10 in accordance with an embodiment of the present invention is provided. Herein, a plurality of shift registers connected in cascade can constitute a gate driving circuit (not shown), e.g., a gate on array (GOA) circuit. Each of the shift registers serves as a stage of the GOA circuit. Moreover, the shift register 10 can be any one stage of the cascade-connected shift registers.

As illustrated in FIG. 1, showing a schematic circuit diagram of the shift register 10. In particular, the shift register 10 includes a control circuit 11, a pull-up circuit 13, a pull-down circuit 15 and a reset circuit 17.

In regard to the circuit configuration of the control circuit 11 of the shift register 10, in one aspect, when the shift register 10 serves as any one stage of the cascade-connected shift registers rather than the first-stage, the control circuit 11 of the shift register 10 can use the circuit configuration as illustrated in FIG. 1. More specifically, the control circuit 11 includes transistors T1b and T1 connected in cascade. The gate of the transistor T1b is electrically coupled to receive an enabling signal Q(N−1), where N is a positive integer and greater than 1, the source/drain of the transistor T1b is electrically coupled to the gate of the transistor T1, the drain/source of the transistor T1b is electrically coupled to receive a clock signal XCK. The source/drain of the transistor T1 is electrically coupled to a node Q, and the drain/source of the transistor T1 is electrically coupled to receive the start pulse signal ST(N−1). When the transistor T1 is enabled after the transistor T1b is enabled by the enabling signal Q(N−1), the transistor T1 will generate a control signal according to the start pulse signal ST(N−1) and output to the node Q. Herein, the start pulse signal ST(N−1) and the enabling signal Q(N−1) both are generated from the previous-stage shift register in the cascade-connected shift registers with respect to the shift register 10, and in the illustrated embodiment, the start pulse signal ST(N−1) is generated from the node Q of the previous-stage shift register, and the enabling signal Q(N−1) is a gate pulse signal generated from the previous-stage shift register.

Figure 2:
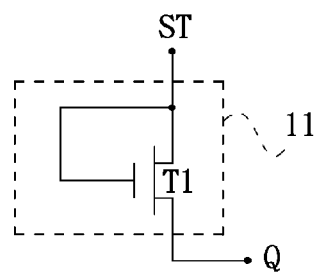
FIG. 2 is a schematic circuit diagram of a control circuit of a shift register in accordance with another embodiment of the present invention.

In another aspect, when the shift register 10 serves as the first-stage shift register of the cascade-connected shift registers, the control circuit 11 of the shift register 10 can use the circuit configuration as illustrated in FIG. 2. In particular, the control circuit 11 includes a single transistor T1 connected in diode mode. The source/drain of the transistor T1 is electrically coupled to the node Q, the drain/source of the transistor T1 is electrically coupled to receive the start pulse signal ST, and the gate of the transistor T1 is electrically connected to the drain/source of the transistor T1. Herein, the start pulse signal ST generally is provided by an external circuit rather than any one stage of the cascade-connected shift registers. When the transistor T1 is enabled by the start pulse signal ST, the transistor T1 will generate a control signal according to the start pulse signal ST and output to the node Q.

Turning back to FIG. 1, the pull-up circuit 13 includes a dual-gate transistor T2 and a capacitor Cs. The bottom gate $G_B$ of the dual-gate transistor T2 is electrically coupled to the node Q and for receiving the control signal generated from the control circuit 11, the top gate $G_T$ is electrically connected to the bottom gate $G_B$ and thereby obtains a predetermined voltage. The drain/source of the dual-gate transistor T2 is electrically coupled to receive a clock signal CK, and the source/drain of the dual-gate transistor T2 serves as an output terminal for a gate pulse signal Gate(N). The capacitor Cs is electrically coupled between the bottom gate $G_B$ and the source/drain of the dual-gate transistor T2. The capacitor Cs can be a parasitic capacitance or an additionally formed capacitor. When the pull-up circuit 13 is enabled by the control signal at the node Q, the dual-gate transistor T2 is turned on and then generates the gate pulse signal Gate(N) according to the clock signal CK. Herein, the clock signal CK and the above-mentioned clock signal XCK are phase-inverted with respect to each other.

The pull-down circuit 15 is electrically coupled between the node Q and the power supply voltage VSS and further electrically coupled to the source/drain of the dual-gate transistor T2. During the pull-up circuit 13 is disabled, the pull-down circuit 15 pulls a potential at the node Q (i.e., the potential at the bottom gate $G_B$ of the dual-gate transistor T2) and another potential at the source/drain of the dual-gate transistor T2 down to the power supply voltage VSS.

The reset circuit 17 is electrically coupled to both the node Q and the source/drain of the dual-gate transistor T2. The reset circuit 17 is for resetting the potential at the node Q and the potential at the source/drain of the dual-gate transistor T2 when being enabled by the start pulse signal ST. In particular, the reset circuit 17 includes transistors T3 and T4, the gate of the transistor T3 is electrically coupled with the gate of the transistor T4 and both are electrically coupled to receive the start pulse signal ST, the source/drain of the transistor T3 is electrically coupled to the power supply voltage VSS, the drain/source of the transistor T3 is electrically coupled to the node Q, the source/drain of the transistor T4 is electrically coupled to a predetermined potential e.g., the clock signal CK, the clock signal XCK, the power supply potential VSS or a grounding potential GND, the drain/source of the transistor T4 is electrically coupled to the source/drain of the dual-gate transistor T2. Herein, it is noted that: in one aspect, when the shift register 10 serves as the first-stage shift register of the cascade-connected shift registers, it is unnecessary to be given the reset circuit 17; in another aspect, when the shift register 10 serves as any one stage of the other-stage shift registers rather than the first-stage, the reset circuit 17 whether or not is configured in the shift register 10 can be determined according to the requirement of actual application.

Figure 3:
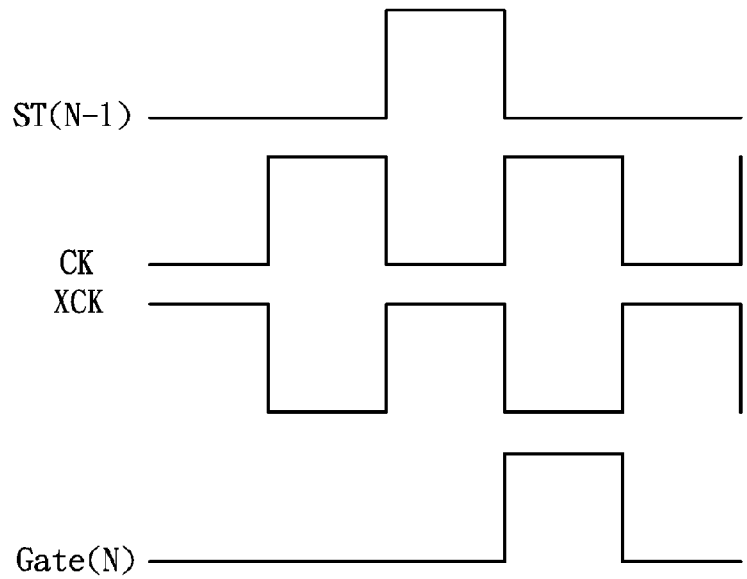
FIG. 3 is a timing diagram of multiple signals associated with the shift register of FIG. 1.

An operation of the shift register 10 will be described below in detail with reference to FIGS. 1 and 3. More specifically, as illustrated in FIG. 3, when the start pulse signal ST(N−1) is logic high level, the clock signal XCK is logic high level and delivered to the gate of the transistor T1 through the turn-on transistor T1b so as to turn on the transistor T1, then the turn-on transistor T1 delivers the start pulse signal ST(N−1) to the node Q and thereby a potential of the node Q becomes logic high level (i.e., the control signal is logic high level). At this moment, the logic high level at the node Q will charge the capacitor Cs in the pull-up circuit 13 so as to turn on the dual-gate transistor T2. Subsequently, the clock signal XCK becomes logic low level while the clock signal CK is logic high level, the potential at the source/drain of the dual-gate transistor T2 is pulled up to the logic high level of the clock signal CK to output the gate pulse signal Gate(N), the node Q will increase the same amount of charges as the source/drain of the dual-gate transistor T2 due to the characteristics of continuous voltage across the capacitor Cs.

In the above-mentioned embodiment, since the top gate $G_T$ and the bottom gate $G_B$ of the dual-gate transistor T2 are electrically connected with each other, although the dual-gate transistor T2 can maintain a high conduction current, it also has a high turn-off current of side effect, so that the leakage current is large.

Figure 4:
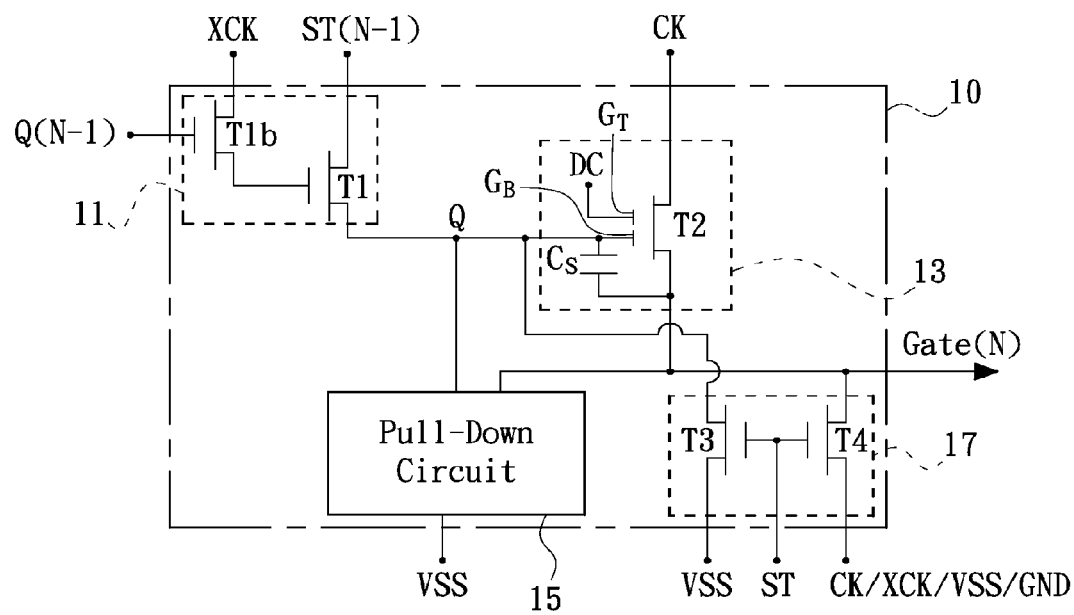
FIG. 4 is a schematic circuit diagram of a shift register in accordance with still another embodiment of the present invention.

In another embodiment, as illustrated in FIG. 4, the top gate $G_T$ of the dual-gate transistor T2 is independent and insulated from the bottom gate $G_B$, for example the top gate $G_T$ is changed to be electrically coupled with a direct current voltage DC. Such solution can decrease the turn-off current of the dual-gate transistor T2, but also decrease the conduction current of the dual-gate transistor T2 in some degree. In addition, with regard to the design of the control circuit 11, it is not limited to be the circuit configuration as illustrated in FIG. 4 and may be the circuit configuration as illustrated in FIG. 2 or other suitable circuit configuration.

Figure 5:
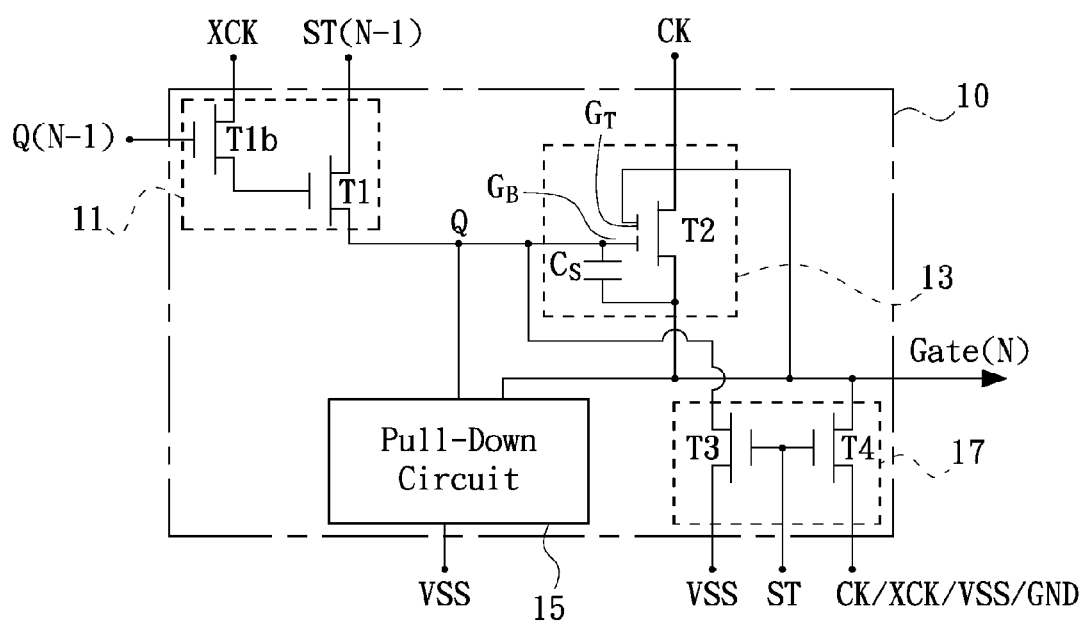
FIG. 5 is a schematic circuit diagram of a shift register in accordance with even still another embodiment of the present invention.

In other embodiment, as illustrated in FIG. 5, the top gate $G_T$ of the dual-gate transistor T2 is changed to be electrically coupled with the source/drain of the dual-gate transistor T2 (i.e., the output terminal for the gate pulse signal Gate(N)), so that the top gate $G_T$ of the dual-gate transistor T2 is electrically coupled to receive a variable voltage. Correspondingly, when the shift register 10 outputs the gate pulse signal Gate (N), the top gate $G_T$ of the dual-gate transistor T2 is provided a high potential so that the dual-gate transistor T2 has a high conduction current; when the output of the shift register 10 is logic low level, the top gate $G_T$ of the dual-gate transistor T2 is provided a negative potential so that the dual-gate transistor T2 can have a low turn-off current. In addition, with regard to the design of the control circuit 11, it is not limited to be the circuit configuration as illustrated in FIG. 5 and may be the circuit configuration as illustrated in FIG. 2 or other suitable circuit configuration.

In summary, the above-mentioned embodiments of the present invention use the dual-gate transistor in the pull-up circuit, compared with the single-gate transistor, the dual-gate transistor would have a relatively larger conduction current than the single-gate transistor with the same size as the dual-gate transistor. Accordingly, the dual-gate transistor can be configured with a small size and thereby can achieve the advantage of low power consumption. Furthermore, by suitably changing the electrical connection of the top gate of the dual-gate transistor, the shift register can be endowed with different performance, and therefore the user can choose any one of the above-mentioned solutions according to the requirement of actual application.

Additionally, the skilled person in the art can make some modifications with respect to the shift register in accordance with the above-mentioned embodiments, for example, suitably changing the circuit configuration of the control circuit, the circuit configuration of the pull-up circuit, whether or not configuring the reset circuit in the shift register, suitably interchanging the electrical connections of the clock pulses CK and XCK according to the position of the shift register in the cascade-connected shift registers, and/or interchanging the connections of the sources and the drains of the respective transistors, as long as such modification(s) would not depart from the scope and spirit of the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A shift register comprising:
 a control circuit, for generating a control signal according to a start pulse signal during the control circuit is enabled;
 a pull-up circuit, for generating a gate pulse signal according to a clock signal during the pull-up circuit is enabled by the control signal, wherein the pull-up circuit comprises a dual-gate transistor, a first gate of the dual-gate transistor is electrically coupled to receive the control signal, a second gate of the dual-gate transistor is electrically coupled to receive a predetermined voltage, the first source/drain of the dual-gate transistor serves as an output terminal for the gate pulse signal, and the second source/drain of the dual-gate transistor is electrically coupled to receive the clock signal; and
 a pull-down circuit, for pulling a potential at the first gate of the dual-gate transistor and another potential at the output terminal for the gate pulse signal down to a power supply potential;
 wherein the control circuit comprises a first transistor and a second transistor, the gate of the first transistor is electrically coupled to receive an enabling signal, the first source/drain of the first transistor is electrically coupled to the gate of the second transistor, and the second source/drain of the first transistor is electrically coupled to receive another clock signal phase-inverted with respect to the clock signal; the first source/drain of the second transistor serves as an output terminal for the control signal, and the second source/drain of the second transistor is electrically coupled to receive the start pulse signal.

2. The shift register as claimed in claim 1, further comprising a reset circuit, for resetting both of the potential at the first gate of the dual-gate transistor and the potential at the output terminal for the gate pulse signal.

3. The shift register as claimed in claim 1, wherein the second gate of the dual-gate transistor is electrically connected with the first gate.

4. The shift register as claimed in claim 1, wherein the second gate of the dual-gate transistor is independent and insulated from the first gate.

5. The shift register as claimed in claim 4, wherein the second gate of the dual-gate transistor is electrically coupled to a direct current voltage.

6. The shift register as claimed in claim 4, wherein the second gate of the dual-gate transistor is electrically coupled to a variable voltage.

7. The shift register as claimed in claim 6, wherein the second gate of the dual-gate transistor is electrically coupled to the output terminal for the gate pulse signal.

8. The shift register as claimed in claim 1, wherein the pull-up circuit further comprises a capacitor, the capacitor is electrically coupled between the first gate and the first source/drain of the dual-gate transistor.

* * * * *